(12) United States Patent
Shimazaki et al.

(10) Patent No.: US 9,391,064 B2
(45) Date of Patent: Jul. 12, 2016

(54) SEMICONDUCTOR DEVICE

(71) Applicant: SEIKO INSTRUMENTS INC., Chiba-shi, Chiba (JP)

(72) Inventors: Koichi Shimazaki, Chiba (JP); Yoshitsugu Hirose, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/761,672

(22) PCT Filed: Dec. 20, 2013

(86) PCT No.: PCT/JP2013/084289
§ 371 (c)(1),
(2) Date: Jul. 17, 2015

(87) PCT Pub. No.: WO2014/112294
PCT Pub. Date: Jul. 24, 2014

(65) Prior Publication Data
US 2015/0364465 A1   Dec. 17, 2015

(30) Foreign Application Priority Data

Jan. 18, 2013   (JP) ................................. 2013-007152

(51) Int. Cl.
| | | |
|---|---|---|
| *H01L 27/088* | (2006.01) | |
| *H01L 27/02* | (2006.01) | |
| *H01L 29/417* | (2006.01) | |
| *H01L 23/535* | (2006.01) | |
| *H01L 29/78* | (2006.01) | |

(52) U.S. Cl.
CPC .......... *H01L 27/0266* (2013.01); *H01L 23/535* (2013.01); *H01L 27/0207* (2013.01); *H01L 27/0277* (2013.01); *H01L 29/41758* (2013.01); *H01L 29/78* (2013.01)

(58) Field of Classification Search
CPC .............. H01L 27/0266; H01L 23/535; H01L 27/0277; H01L 29/41758; H01L 27/0207; H01L 29/78; H01L 27/0292
See application file for complete search history.

(56) References Cited

U.S. PATENT DOCUMENTS

| | | | | |
|---|---|---|---|---|
| 6,310,379 | B1 * | 10/2001 | Andresen ............ | H01L 27/0277 257/355 |
| 2002/0153533 | A1 * | 10/2002 | Okushima ........... | H01L 27/0277 257/173 |
| 2008/0002079 | A1 * | 1/2008 | Kimura ................ | G02B 6/0051 349/42 |
| 2009/0278207 | A1 * | 11/2009 | Greenberg .......... | H01L 23/4824 257/386 |
| 2012/0235210 | A1 * | 9/2012 | Takemae ............... | H01L 29/402 257/194 |

(Continued)

OTHER PUBLICATIONS

International Search Report mailed Mar. 18, 2014 issued in International Appln. No. PCT/JP2013/084289.

(Continued)

*Primary Examiner* — Victor A Mandala
(74) *Attorney, Agent, or Firm* — Adams & Wilks

(57) ABSTRACT

In order to provide a semiconductor device having high ESD tolerance, a semiconductor device (IC) is formed so that: a ground voltage wiring (22*a*) is electrically connected at one end in a wiring direction thereof to a wiring (22*b*) extending from a ground voltage pad used for external connection; an input voltage wiring (23*a*) is electrically connected at one end in a wiring direction thereof to a wiring (23*b*) extending from an input voltage pad used for external connection; and the one end of the ground voltage wiring (22*a*) and the one end of the input voltage wiring (23*a*) are substantially opposed to each other across a center of an NMOS transistor (10).

3 Claims, 2 Drawing Sheets

(56) References Cited

U.S. PATENT DOCUMENTS

2012/0326235 A1* 12/2012 Otsuru ............... H01L 27/0277
                                                        257/355
2013/0127538 A1*  5/2013 Murakami ............ H01L 29/78
                                                        330/277

OTHER PUBLICATIONS

Abstract, Publication No. 2005-294740, Publication Date Oct. 20, 2005.

* cited by examiner

SEMICONDUCTOR DEVICE

TECHNICAL FIELD

The present invention relates to a semiconductor device having an NMOS transistor for an electrostatic discharge (ESD) protection circuit.

BACKGROUND ART

First, a related-art semiconductor device is described. FIG. 2 is a plan view of the related-art semiconductor device.

In general, an NMOS transistor is used for an ESD protection circuit for protecting an internal circuit from ESD. The pattern of the NMOS transistor is laid out as illustrated in FIG. 2, for example.

An NMOS transistor 90 includes a plurality of sources and a plurality of drains that are alternately formed, a plurality of even-numbered channels formed between the respective sources and the respective drains, and a gate 98 formed above the respective channels. The gate 98 is a multi-finger gate, and is formed of one polysilicon. Each source is connected to a source wiring 99, and each drain is connected to a drain wiring 97. The drain wiring 97 is extended to be connected to a pad 80 (see, for example, Patent Literature 1).

CITATION LIST

Patent Literature

[PTL 1] JP 2005-294740 A (FIG. 1)

SUMMARY OF INVENTION

Technical Problem

In the technology disclosed in Patent Literature 1, in FIG. 2, the source wiring 99 is connected from the lower side of FIG. 2, and hence the value of parasitic resistance of the source wiring 99 with respect to a lower channel of FIG. 2 in the NMOS transistor 90 is lower than the value of parasitic resistance of the source wiring 99 with respect to an upper channel of FIG. 2. In other words, the values of the parasitic resistance of the source wiring 99 with respect to the channels differ from one another.

Accordingly a surge current due to ESD is less likely to flow uniformly among the channels. In another viewpoint, the surge current is liable to concentrate on a particular channel. In this case, the surge current is liable to concentrate on the lower channel of FIG. 2. Consequently, in the NMOS transistor 90 for an ESD protection circuit, breakdown is liable to occur due to local heat generation, resulting in low ESD tolerance.

The present invention has been made in view of the above-mentioned problem, and provides a semiconductor device having high ESD tolerance.

Solution to Problem

In order to solve the above-mentioned problem, according to one embodiment of the present invention, there is provided a semiconductor device including an NMOS transistor for an ESD protection circuit, the semiconductor device including: the NMOS transistor including: a plurality of sources and a plurality of drains, which are alternately formed; a plurality of even-numbered channels formed between the plurality of sources and the plurality of drains; and a plurality of gates formed above the plurality of channels; a ground voltage wiring, which is electrically connected at one end in a wiring direction thereof to a wiring extending from a ground voltage pad used for external connection; an input voltage wiring, which is electrically connected at one end in a wiring direction thereof to a wiring extending from an input voltage pad used for external connection; a plurality of source wirings for electrically connecting the ground voltage wiring to the plurality of sources, respectively; a plurality of drain wirings for electrically connecting the input voltage wiring to the plurality of drains, respectively; and a plurality of gate wirings for electrically connecting the ground voltage wiring to the plurality of gates, respectively, in which the one end of the ground voltage wiring and the one end of the input voltage wiring are substantially opposed to each other across a center of the NMOS transistor.

Advantageous Effects of Invention

According to the one embodiment of the present invention, in the respective channels of the NMOS transistor, the values of parasitic resistance of the source wiring and the drain wiring with respect to the respective channels differ from one another, but the values of the total resistance of the parasitic resistance of the source wiring and the parasitic resistance of the drain wiring are substantially equal to one another. Then, the surge current is likely to flow uniformly among the channels. In other words, the surge current is less likely to concentrate on a particular channel. Consequently, in the NMOS transistor for an ESD protection circuit, breakdown due to local heat generation is less likely to occur, resulting in high ESD tolerance.

DESCRIPTION OF EMBODIMENT

Now, an embodiment of the present invention is described with reference to the drawings.

Figure 1:
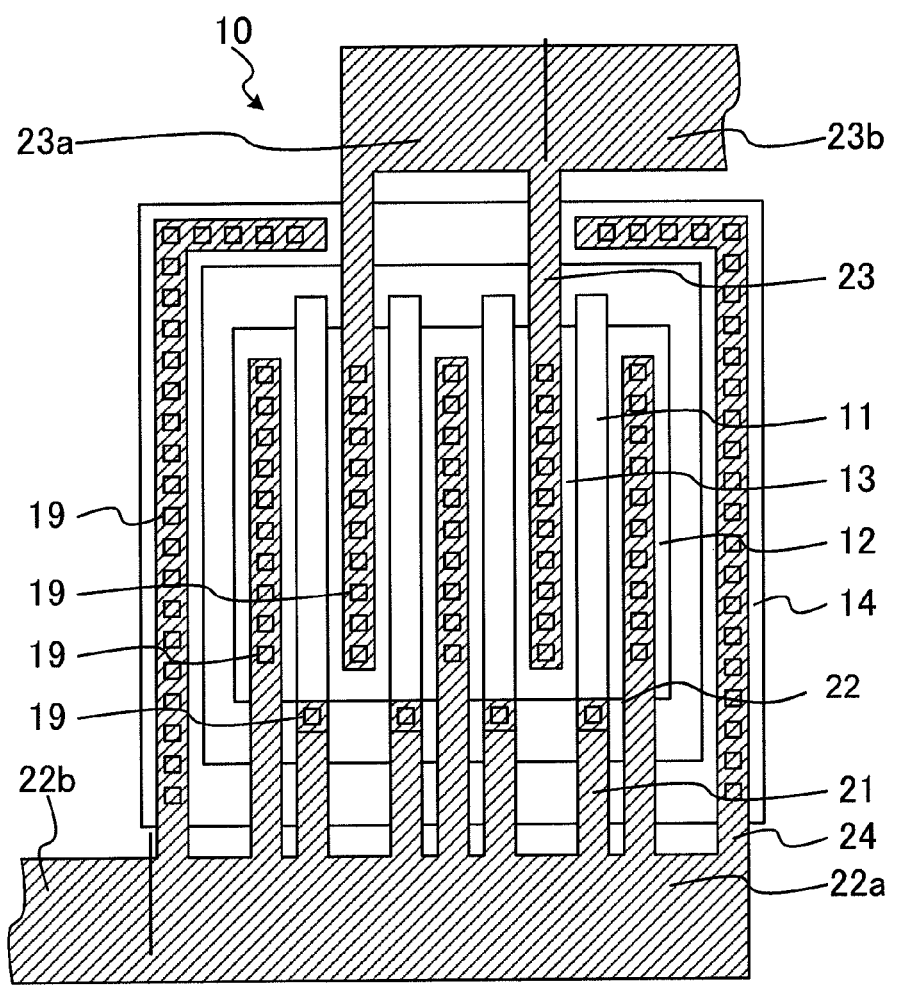
FIG. 1 is a plan view illustrating a semiconductor device.
Figure 1:
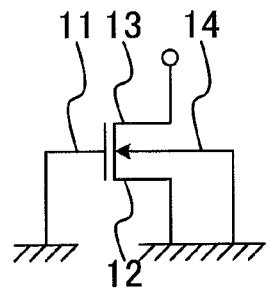
Figure 2:
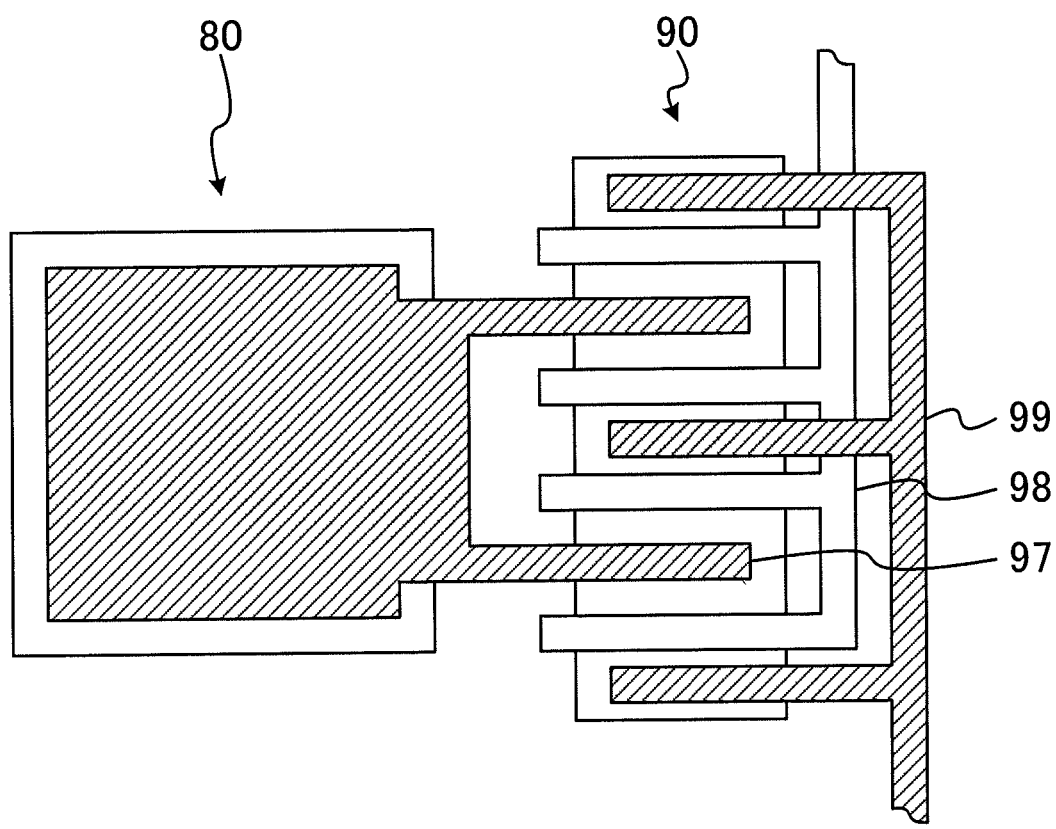
FIG. 2 is a plan view illustrating a related-art semiconductor device.

First, a configuration of a semiconductor device is described. FIG. 1 is a plan view illustrating the semiconductor device.

The semiconductor device includes an NMOS transistor 10 for an ESD protection circuit, a ground voltage wiring 22a, and an input voltage wiring 23a. The NMOS transistor 10 includes a plurality of sources 12 and a plurality of drains 13 that are alternately formed, a plurality of even-numbered channels formed between the sources 12 and the drains 13, a plurality of gates 11 formed above the plurality of channels, and a back gate 14 formed so as to surround the sources 12 and the drains 13. In this case, a diffusion region formed at an outermost end in a channel length direction of the NMOS transistor 10 is the source 12.

Then, the ground voltage wiring 22a is formed into a substantially rectangle, and is electrically connected at one end in a wiring direction thereof to a wiring 22b extending from a ground voltage pad used for external connection. Specifically, in FIG. 1, the wiring 22b extending from the ground voltage pad used for external connection is connected to the ground voltage wiring 22a from the left side, and the one end of the ground voltage wiring 22a at which the wiring 22b is connected runs in the vertical direction of FIG. 1. Similarly, the input voltage wiring 23a is formed into a substantially rectangle, and is electrically connected at another end in a wiring direction thereof to a wiring 23b extending from an input voltage pad used for external connection. Specifically, in FIG. 1, the wiring 23b extending from the input voltage pad used for external connection is connected to the input voltage wiring 23a from the right side, and the another end of the input voltage wiring 23a at which the wiring 23b is connected runs in the vertical direction of FIG. 1. The one end of the ground voltage wiring 22a and the another end of the input voltage wiring 23a are substantially opposed to each other across the center of the NMOS transistor 10. Specifically, the one end of the ground voltage wiring 22a and the another end of the input voltage wiring 23a are formed at substantially point-symmetrical positions. Note that, in this case, the one end of the ground voltage wiring 22a and the another end of the input voltage wiring 23a need to be prevented from being formed at positions vertically symmetrical about the horizontal line in FIG. 1 passing through the center of the NMOS transistor 10. Further, in general, the wiring 22b extending from the ground voltage pad used for external connection and the wiring 23b extending from the input voltage pad used for external connection are each formed in parallel to the channel length direction of the NMOS transistor 10.

A plurality of source wirings 22 electrically connect the ground voltage wiring 22a to the plurality of sources 12 via contacts 19, respectively. A plurality of drain wirings 23 electrically connect the input voltage wiring 23a to the plurality of drains 13 via contacts 19, respectively. A plurality of gate wirings 21 electrically connect the ground voltage wiring 22a to the plurality of gates 11 via contacts 19, respectively. A back gate wiring 24 electrically connects the ground voltage wiring 22a to the back gate 14 via contacts 19.

In this case, the gates 11 are formed of polysilicon on a semiconductor substrate. The sources 12 and the drains 13 are N-type diffusion regions formed in a surface of the P-type semiconductor substrate. The back gate 14 is a P-type diffusion region formed in the surface of the P-type semiconductor substrate. All the wirings, such as the source wiring 22, are formed of metal films made of aluminum, copper, or the like on the semiconductor substrate.

Further, the plurality of source wirings 22 are formed of metal films having the same shape. The plurality of drain wirings 23 are formed of metal films having the same shape. The plurality of gate wirings 21 are formed of metal films having the same shape.

Next, a description is given of an operation of the NMOS transistor 10 for an ESD protection circuit for protecting an internal circuit from electrostatic discharge (ESD) at the time when an input voltage to the input voltage pad used for external connection is normal.

A voltage between the source 12 and the gate 11 and between the source 12 and the back gate 14 is the ground voltage, and a voltage of the drain 13 is the input voltage. Accordingly, in the normal state, the NMOS transistor 10 is turned off and does not affect the input voltage applied to the drain 13.

Next, a description is given of an ESD protective operation of the NMOS transistor 10 at the time when a surge current due to ESD flows through the input voltage pad used for external connection.

The surge current due to ESD flows from the input voltage pad to the ground voltage pad. At this time, the parasitic diode of the NMOS transistor 10 causes the surge current to flow in the reverse direction by breakdown operation. Then, although the input voltage pad is electrically connected to the internal circuit of the semiconductor device, the surge current from the input voltage pad does not flow to the internal circuit. Consequently, the internal circuit is protected from the surge current.

At this time, in the NMOS transistor 10, the source 12 close to the wiring 22b extending from the ground voltage pad has a small value of parasitic resistance with respect to the ground voltage pad, and the source 12 far from the wiring 22b has a large value of parasitic resistance. Similarly, the drain 13 close to the wiring 23b extending from the input voltage pad has a small value of parasitic resistance with respect to the input voltage pad, and the drain 13 far from the wiring 23b has a large value of parasitic resistance. In other words, in the respective channels of the NMOS transistor 10, the values of parasitic resistance of the source wiring 22 and the drain wiring 23 with respect to the respective channels differ from one another, but the values of the total resistance of the parasitic resistance of the source wiring 22 and the parasitic resistance of the drain wiring 23 are substantially equal to one another. The surge current is then likely to flow uniformly among the channels. In other words, the surge current is less likely to concentrate on a particular channel. Consequently, in the NMOS transistor 10 for an ESD protection circuit, breakdown due to local heat generation is less likely to occur, resulting in high ESD tolerance.

Thus, when the one end of the ground voltage wiring 22a and the another end of the input voltage wiring 23a are placed at positions vertically symmetrical about the horizontal line in FIG. 1 passing through the center of the NMOS transistor 10, the above-mentioned effect cannot be obtained, and the difference in parasitic resistance is generated between the channel close to the center and the channel far from the center, with the result that the uniform operation is difficult to perform.

Note that, the gates 11 may be connected to one another by polysilicon.

Further, each gate 11 may be connected to each source wiring 22 instead of being connected to the ground voltage wiring 22a.

Further, in each gate 11, a resistive component may exist between the gate 11 and the ground voltage wiring 22a.

Further, the source 12, the drain 13, and the back gate 14 may be formed in a surface of a P-type well instead of being formed in the P-type semiconductor substrate.

REFERENCE SIGNS LIST

10 NMOS transistor
11 gate
12 source
13 drain
14 back gate
19 contact
21 gate wiring
22 source wiring
22a ground voltage wiring
22b wiring extending from ground voltage pad
23 drain wiring
23a input voltage wiring
23b wiring extending from input voltage pad
24 back gate wiring

The invention claimed is:
1. A semiconductor device, comprising:
a semiconductor substrate;
an NMOS transistor, comprising:
a plurality of sources and a plurality of drains alternately formed in a surface of the semiconductor substrate;

an even number of channels formed between the plurality of sources and the plurality of drains; and a plurality of gates formed above the even number of channels;

a ground voltage wiring electrically connected to the plurality of sources through a plurality of source wirings;

an input voltage wiring electrically connected to the plurality of drains through a plurality of drain wirings;

a plurality of gate wirings for electrically connecting the ground voltage wiring to the plurality of gates, respectively;

a wiring extending from a ground voltage pad used for external connection, the wiring being electrically connected to one end of the ground voltage wiring; and a wiring extending from an input voltage pad used for external connection, the wiring being electrically connected to another end of the input voltage wiring, the one end of the ground voltage wiring and the another end of the input voltage wiring opposed to each other across a center of the NMOS transistor, and the wiring formed at the one end extending from the ground voltage pad used for external connection, and the wiring formed at the another end extending from the input voltage pad used for external connection, each being formed in parallel to a channel length direction of the NMOS transistor.

2. A semiconductor device according to claim 1, wherein the plurality of source wirings are formed of metal films having the same shape, and wherein the plurality of drain wirings are formed of metal films having the same shape.

3. A semiconductor device according to claim 2, wherein the plurality of gate wirings are formed of metal films having the same shape.

* * * * *